United States Patent
Tang et al.

[11] Patent Number: 6,156,485
[45] Date of Patent: Dec. 5, 2000

[54] FILM SCHEME TO SOLVE HIGH ASPECT RATIO METAL ETCH MASKING LAYER SELECTIVITY AND IMPROVE PHOTO I-LINE PR RESOLUTION CAPABILITY IN QUARTER-MICRON TECHNOLOGY

[75] Inventors: Wen-Hsiang Tang; Yi-Fei Wang, both of Taipei; Chih-Shen Hung; Cheng-Hao Huang, both of Hsin-Chu, all of Taiwan

[73] Assignee: Taiwan Semiconductor Manufacturing Company Ltd., Hsin-Chu, Taiwan

[21] Appl. No.: 09/234,055

[22] Filed: Jan. 19, 1999

[51] Int. Cl.[7] .......................... G03C 5/00; H01L 21/302; B44C 1/22
[52] U.S. Cl. .......................... 430/313; 430/316; 438/723; 216/43; 216/47; 216/41
[58] Field of Search .................................... 430/313, 316; 438/723; 216/41, 47, 43

[56] References Cited

U.S. PATENT DOCUMENTS

| | | | |
|---|---|---|---|
| 4,532,002 | 7/1985 | White | 156/643 |
| 4,617,193 | 10/1986 | Wu | 427/38 |
| 5,100,503 | 3/1992 | Allman et al. | 156/643 |
| 5,277,749 | 1/1994 | Griffith et al. | 156/643 |
| 5,587,090 | 12/1996 | Belcher et al. | 216/17 |
| 6,008,135 | 12/1999 | Oh et al. | 438/720 |
| 6,013,582 | 1/2000 | Ionov et al. | 438/738 |
| 6,027,861 | 2/2000 | Yu et al. | 430/316 |

*Primary Examiner*—C. H. Kelly
*Attorney, Agent, or Firm*—George O. Saile; Stephen B. Ackerman

[57] ABSTRACT

A method of high aspect ratio etching (HARE) of metal layers in quarter micron technology is disclosed. High aspect ratio patterns are encountered because of the shrinking lateral dimensions over the constant remaining thickness of the features of ultra large scaled integrated chips. HARE is accomplished by employing a tungsten W-hardmask with a high selectivity of 10:1 with respect to the immediately underlying aluminum-copper metal layer. In order to protect the lithographic integrity, overlying organic BARC is used to prevent reflections from the W-hardmask as well as from the underlying metal layer. The lithographic resolution is further improved by using a thin photoresist layer in combination with the high selectivity hardmask. In this manner, the tradeoff that normally has to be made between a high resolution process and a reliable metal etch is circumvented.

26 Claims, 3 Drawing Sheets

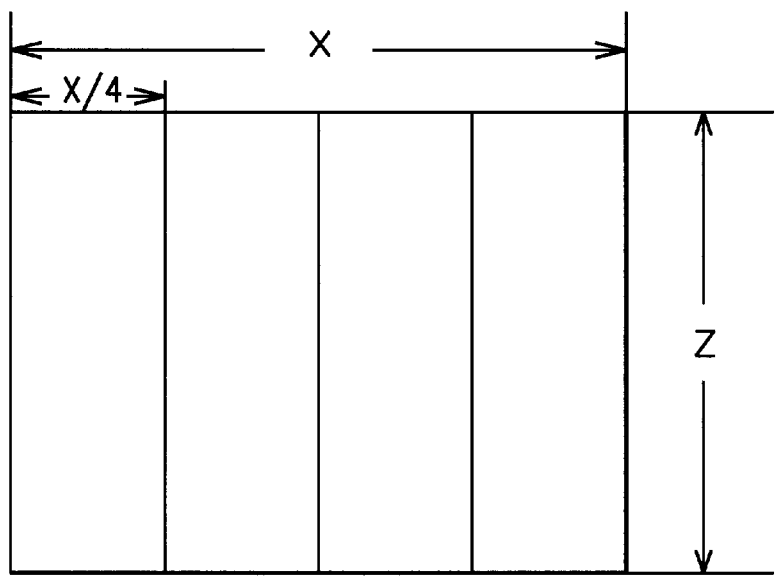
FIG. 1 - Prior Art
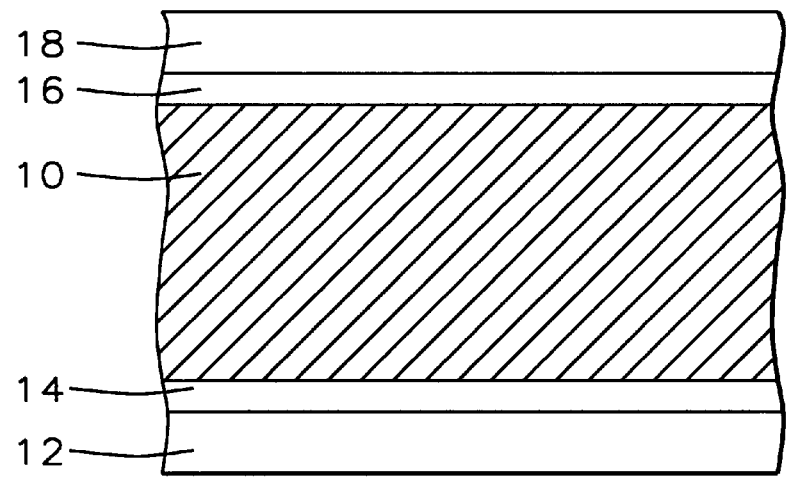
FIG. 2 - Prior Art

FILM SCHEME TO SOLVE HIGH ASPECT RATIO METAL ETCH MASKING LAYER SELECTIVITY AND IMPROVE PHOTO I-LINE PR RESOLUTION CAPABILITY IN QUARTER-MICRON TECHNOLOGY

BACKGROUND OF THE INVENTION (1) Field of the Invention

The present invention relates to multilevel interconnects employed in semiconductor technology in general, and in particular, to a method of forming defect free interconnects of high aspect ratio found in quarter-micron technology.

(2) Description of the Related Art

The large, very large and ultra large scale integration of chips, also known as LSI, VLSI and ULSI, respectively, of the semiconductor technology have brought along challenges associated with packing many more devices in smaller spaces. Packing density of chips has been increasing not only in the areal dimensions, but also in the third dimension where many more layers are being added in the vertical direction. Thus, multi-levels of interconnections, or wires, are formed in order to be able to connect the thousands of devices that are formed in the underlying semiconductor substrate. The number of levels of interconnects required for the quarter-micron technology can be upwards of five or more.

Comparing quarter-micron technology with one-micron technology for illustrative purposes, where the feature size refers to the gate length of a metal-oxide semiconductor device, generally all feature sizes are reduced by one quarter on a side. Hence, considering a generalized feature as shown in FIG. 1 having width (x) and thickness (z), the feature has an aspect ratio of (z)/(x). It will be apparent that when the lateral dimensions of the feature are reduced or shrunk, say, by a factor of four, as shown by the phantom lines in FIG. 1, then the width becomes (x/4), and the aspect ratio four times larger. It is with higher aspect ratios that reliability problems arise in forming interconnects in semiconductor substrates. It is proposed in the embodiments of the present invention a method of utilizing a new hard-mask in order to maintain or exceed the required reliability when practicing submicron technologies.

Conventionally, a semiconductor chip contains one or more metal wiring layers that are separated from each other by an insulating layer and are further separated by still another insulating layer from the devices that are formed near the surface of the semiconductor that forms the base of the chip. The wiring stripes are connected to each other and to the devices at the appropriate places by means of holes that are filled with metal through the insulating layers. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist formed on the metal layer. For the first metal layer, electrical contact is made with the underlying devices through contact holes that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

In forming wiring layers, blanket metal must be patterned. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered soluble (positive resist) and be washed away, or insoluble (negative resist) and fix the pattern. In either case, the remaining resist on the surface forms the desired pattern.

Etching of metal lines require precise lithographic processes. The nature of the mask used for etching can affect the lithographic process itself. Thus, when photoresist is used as the mask, its local thickness can vary depending upon the underlying features that it crosses on the substrate. If it crosses a step, for example, then its thickness over the top of the step will be much thinner than that which crosses over low-lying regions. During lithographic exposure, either the thin resist becomes overexposed, or the thicker resist underexposed. Upon development, a resist pattern crossing a step will therefore exhibit a linewidth variation (i.e., narrower on the top of the step). For lines in which step heights approach the size of the linewidth, as would be the case with submicron technologies, such variations in dimension can become unacceptable. It will also be known to those skilled in the art that standing wave effects in thick resist layers reduce lithographic resolution. In addition, reflective substrates also degrade resolution in thick resist films, and for that reason, anti-reflective coating (ARC) is used.

Resolution—which determines the precision of the transferred pattern, say, from a photomask to a photoresist layer to be patterned—is generally governed by the contrast of the resist and also its thickness. In a resist with a perfect contrast, an ideal exposure process would deliver the desired exposing radiation only to the resist region whose dimensions are equal to the pattern of the mask, and there would be no energy delivered elsewhere. In other words, the transferred pattern on the metal would be the exact replica of the pattern in the mask. However, in real exposures, energy is delivered in a more diffused fashion, due to diffraction an scattering. Hence, when developed, the resist will dissolve more in some areas and less in some other areas than required, and the pattern profile will be different from which is copied. It will be appreciated that, under these non-ideal conditions, the thicker the resist, the more sloped or variable will be the walls of the pattern transferred into the resist. This problem, as well as the standing wave and reflections from a reflective surface can be alleviated by employing thin resists, provided that the underlying surface is well planarized. In other words, a thinner mask will in general yield better resolution.

Photoresist, however, not only consumes time and resources but also endangers contamination from the particulates and etchant solutions. Usually, contamination results from the wet etching used in transferring patterns from the photoresist onto the underlying material. Furthermore, wet etching processes are typically isotropic. Therefore, if the thickness of the film being etched is comparable to the minimum pattern dimensions, undercutting due to isotropic etching becomes intolerable, a problem further exacerbated when using submicron technologies. One alternative pattern transfer method that offers the capability of non-isotropic etching is dry etching, as is well known. In dry etching, a hard-mask, such as silicon dioxide or silicon nitride is used in place of photoresist. The etching process is made to be as highly selective as possible against etching the mask layer material, and against the material under the film that is being etched.

In prior art, methods have been devised to employ hard-masks in forming multilayer interconnects in semiconductors to prevent formation of defects as described Shen, et al., in U.S. Pat. No. 5,665,641. Shen points out that the need to have hard masks for metal etching has become critical for the semiconductor industry. The need is driven by the depth of field requirement of the lithography process which is provided by using thinner photoresist. However, thinner resists cause metal etching problems, because the metal etch chemistry exhibits poor selectivity to the resist. This, in turn, causes difficulties in control of critical dimensions (CD). Accordingly, Shen proposes a process for forming a hard mask over an aluminum-containing layer for patterning and etching the aluminum-containing layer to define interconnects. The hard mask must be deposited at a lower temperature than the deposition temperature of the interconnect metal so that the formation of defects in the metal lines is prevented.

Shen's method is shown in FIG. 2. A metal layer (10) comprising an aluminum-containing alloy is formed over an oxide layer (12). The oxide layer (12) is in turn supported over a silicon substrate (not shown). An optional barrier layer (14) of titanium/titanium nitride provides controlled crystallization the Al alloy and may be interposed between the oxide layer (12) and the interconnect layer (10). In patterning the aluminum-containing interconnect layer (10), an anti-reflection coating (ARC) (16) is first deposited on the interconnect layer, followed by formation of the hard mask (18) thereon, which may comprise silicon dioxide or silicon nitride. A photoresist layer (not shown) is deposited on the hard mask (18) and is subsequently exposed to electromagnetic radiation of the appropriate wavelength and developed. Depending upon the nature of the resist (positive or negative), the developed or undeveloped portions are removed, thereby exposing portions of the surface of the underlying oxide (18). Next, exposed portions are removed by etching to expose corresponding portions of the surface of the ARC (16), which in turn are also removed by etching. The process is repeated to expose corresponding portion of the surface of the interconnect layer (10), which are then removed by etching to form the desired interconnect pattern.

Baker, et al., in U.S. Pat. No. 5,567,334 proposes a method for creating digital micromirror device using an aluminum hard mask. In this manner, he avoids the use of a sacrificial oxide hard mask. Cote, et al., on the other hand, use a hard metal in forming electrically conducting vias and lines by a three step process. As described in U.S. Pat. No. 5,262,354, first, a controlled amount of soft, low resistivity metal is deposited in a trench or hole to a point below the top surface of a dielectric layer in which the trench or hole is formed. Subsequently, the low resistivity metal is over-coated with a hard metal such CVD tungsten. Finally, chemical-mechanical polishing is used to planarize the structure.

Lee, in U.S. Pat. No. 5,431,770 shows a method for forming transistors having sublithograpic features, for example, gates. A patterned hard-mask (formed, for example from PETEOS) is created overlying oxide and polysilicon layers. The dimensions of the hard-mask are reduced by isotropic etching. The reduced dimension hard-mask is used with an anisotropic etching process to define a reduced dimension feature such as a gate.

It will be apparent to those skilled in the art that in prior art methods, there is usually a trade-off between having a thin enough mask to provide the required resolution for submicron technology features on the one hand, and making the mask thick enough, on the other, so that the potential for damaging the metal line is minimized. What is needed is a thin hard-mask of appropriate material that can be used directly over the metal to be etched and not be affected by the etchant gases so as to cause any defects in the underlying metal to be etched. This is shown in the embodiments of the present invention.

SUMMARY OF THE INVENTION

It is therefore an object of this invention to provide a method of forming a high selectivity metal etch masking film in order to improve photolithography resolution in quarter-micron technology.

It is still another object of the present invention to provide a method of reducing the thickness of the photoresist mask in order to improve photolithography resolution in quarter-micron technology.

It is yet another object of this invention to provide a method of providing a high etch resistance material as a mask in high aspect ratio etch.

It is still another object of this invention to provide a method of preventing etch damage in forming metal lines in submicron technologies.

These objectives are accomplished by providing a semiconductor substrate having a substructure of devices, and a first metal layer formed thereon; forming a dielectric layer over said first metal layer; forming a glue layer over said dielectric layer; forming a second metal layer over said glue layer; forming a W-hardmask layer over said second metal layer; forming a bottom anti-reflective coating (BARC) over said W-hardmask layer; forming an organic BARC layer over said W-hardmask layer; forming a photoresist layer over said BARC; forming said photoresist layer with metal pattern; etching said metal pattern into said BARC and W-hardmask layer underlying said photoresist layer; removing said photoresist layer; removing said organic BARC layer; and transferring said line pattern in W-hardmask layer into said second metal layer, thus completing the patterning of said metal layer.

In another embodiment, silicon-oxynitride (SION) is used in place of BARC.

BRIEF DESCRIPTION OF THE DRAWINGS

FIG. 1 is a schematic representation of the aspect ratio of depth over the lateral dimensions of features found in the related art of semiconductors.

FIG. 2 is a partial cross-sectional view of a semiconductor substrate showing the forming of a metal layer of prior art.

DESCRIPTION OF THE PREFERRED EMBODIMENTS

Figure 3A:
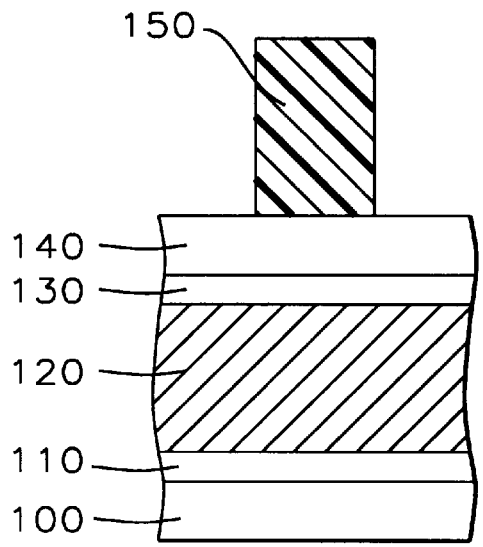
FIG. 3A is a partial cross-sectional view of a semiconductor substrate showing the patterning of the thick photoresist layer according to this invention.

Reference is now made to a specific embodiment in FIGS. 4A–4D which illustrate the best mode presently contemplated by the inventors for practicing the invention. However, an alternative embodiment will be first described in FIGS. 3A–3D in order to point out the need for the particular metal etch masking layer used in patterning metal layers of this invention.

In both embodiments, a semiconductor substrate (100) is provided with a substructure of devices formed in the substrate and/or metal layers thereof. As the substructure itself is not significant to the invention, it is not described in detail in order not to unnecessarily obscure the present invention. It will be understood by those skilled in the art that contacts are formed in an interlevel dielectric layer in which the contacts provide connections between a source-drain, salicide or polysilicon to a metal layer, while vias are formed within upper dielectric layers where the vias provide interconnections between metal layers. Thus, the horizontal metal layers containing line patterns and the metal plugs in the vertical contacts and vias spanning the metal layers, together, form the vias spanning the metal layers, together, form the interconnections between the devices in a semiconductor substrate. The top layer in the substructure of both embodiments is a dielectric layer (not shown) on which a second metal layer will be formed. In order to promote adhesion between the dielectric layer and the second metal layer, a glue layer is usually employed. It is preferred that this glue layer (110) comprise titanium nitride, TiN.

For precise patterning of metal layers with precisely dimensioned lines and other features, it is important that the masking material used for etching the metal has the proper characteristics to withstand the corrosive and abrasive action of the etchants. If the etch mask over a metal layer cannot hold its shape and dimensions when exposed to an etchant used to etch the underlying metal, then the resulting pattern in the metal layer will be defective having shorts or opens, as is known in the art. Often, a tradeoff must be made between the thickness of the mask being used and the etching that is performed in patterning metals. As mentioned earlier, better lithographic resolution is obtained when thinner mask is used. However, a thinner mask is more apt to be consumed by etchants for a given selectivity of the etchant against the mask material. However, it will be shown in the preferred embodiment of this invention in FIGS. 4A–4D that with a combination of both a thin photoresist mask and a high selectivity hardmask, the proper etching need no longer be compromised. It will be apparent that the method disclosed is especially suitable for submicron technologies where the aspect ratio of the patterns to be etched in metal layers is high by virtue of the shrinking lateral dimensions over relatively constant remaining thicknesses. High aspect ratio etching, or, HARE, of metal is possible by a judicious choosing of a high selectivity hardmask of this invention which can withstand the rigors of metal etching.

First, in FIG. 3A, a relatively thick photoresist (150), in the range between about 1.1 to 1.6 microns (um), is formed over an aluminum-copper metal layer (120) with intervening layers of an anti-reflective coating (ARC) (130) on the metal layer and a plasma enhanced oxide (PE OX) (140) layer over the ARC. Aluminum-copper is deposited to a thickness between about 3000 to 10000 Å over the titanium nitride glue layer (110) while ARC layer (130), which is also TiN, is deposited to a thickness between about 250 to 1000. The plasma enhanced chemical vapor deposition of oxide layer (140) is accomplished at a chamber pressure between about 1 to 3 torr, temperature between about 300° C. to 500° C. with reactant gases $SiH_4$, $N_2O$ at a flow rate between about 10 to 2000 sccm in a diluent carrier gas at a flow rate between about 0 to 10000 sccm, and an rf power between about 50 to 2000 KeV to a thickness between about 1000 to 5000 Å.

Figure 3B:
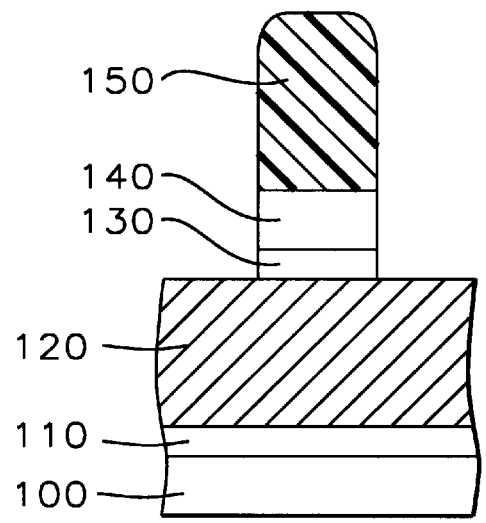
FIG. 3B is a partial cross-sectional view of a semiconductor substrate showing the forming of the PEOX hardmask and ARC layers of this invention.

The photoresist layer (150) is next patterned as shown in FIG. 3A. Using the patterned photoresist as a mask, the PEOX and ARC layers are etched as shown in FIG. 3B with an etch recipe comprising $Cl_2$, $BCl_3$, $CF_4$ gases at a pressure between about 10 to 150 mT and power between about 100 to 1500 watts. It will be noted in FIG. 3B that the photoresist has been consumed, or, eroded, to rounded tops during the etching process. However, due to the relative large thickness of the photoresist, the underlying PEOX and ARC have been protected from further erosion. On the other hand, the resolution of the pattern will have been compromised due to the thickness of the photoresist. It will be shown in the preferred embodiment of this invention that the resolution can be further improved by reducing the thickness of the photoresist in combination with a different hardmask that is used to etch the aluminum-copper layer.

Figure 3C:
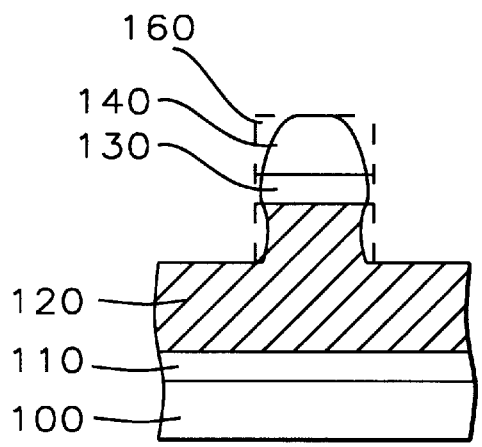
FIG. 3C is a partial cross-sectional view of a semiconductor substrate showing the erosion of the PEOX hardmask and ARC layers while etching the metal layer of this invention. hardmask and ARC layers while etching the metal layer of this invention.
Figure 3D:
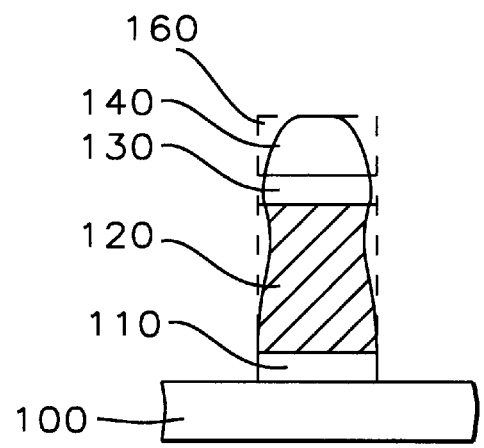
FIG. 3D is a partial cross-sectional view of a semiconductor substrate showing the profile of the pattern etched into the metal layer of this invention.

After the etching of the PEOX and ARC layers, the photoresist layer is removed by oxygen plasma ashing. The PEOX layer so formed is then used as the hardmask for etching the aluminum-copper layer (120) as shown in the first embodiment of this invention, in FIG. 3C. The etch comprises a chlorine ($Cl_2$) based recipe such as $Cl_2$ at a flow rate between about 0 to 200 sccm with $BCl_3$ between about 10 to 200 sccm and RF power of between about 50 to 2000 watts, and pressure between about 5 to 200 mT. It will be noted that fluorine-containing gases used to etch silicon and oxides are not suitable for etching aluminum. Because the chlorine based recipe has a somewhat low selectivity ratio of 3.5:1 with respect to PEOX as measured against aluminum-copper, the PEOX is consumed as shown in FIG. 3C while the aluminum-copper layer is being etched. Furthermore, the ARC layer (130) is also consumed. Consequently, when the etch is complete, the resulting aluminum-copper pattern has a profile shown in FIG. 3D, which is different from the straight-walled original pattern (150) that was formed in FIG. 3A.

Figure 4A:
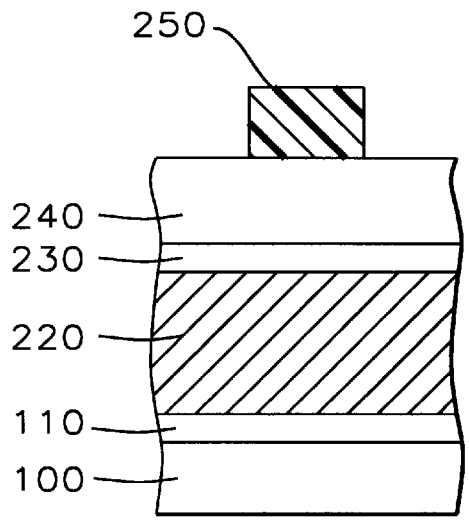
FIG. 4A is a partial cross-sectional view of a semiconductor substrate showing the patterning of the thin photoresist layer according to the preferred embodiment of this invention.

A pattern with better defined profile is obtained by improving the resolution with a thinner photoresist as shown in FIG. 4A of the second embodiment of this invention. As is well known, the resolution of a lithographic process is usually defined in terms of the modulation transfer function of the lithography exposure equipment and how well it is matched to mask material being used. The mercury-vapor lamps that are used in exposure equipment for integrated chip fabrication have an emission spectrum of non-uniform intensity with several intense, sharp lines. In the UV wavelength range from 350 to 450 nanometers (nm), there are three strong lines, the I-line (365 nm), the H-line (405 nm), and the G-line (436 nm). With the disclosed thinning of the photoresist layer (250) and the placement of a tungsten hardmask, in place of the PEOX hardmask, over the metal layer (220), it is possible to utilize the I-line equipment for the finer metal patterns of this invention in the practice of the quarter-micron technology.

Thus, in the preferred embodiment of this invention, a photoresist layer of thickness between about 0.5 to 0.7 μm is used. The photoresist layer is formed and patterned over an organic layer, which is a Bottom Anti-reflective Coating, or BARC, and has a thickness of only between about 500 to 2000 Å. The BARC, known in the art, may or may not be organic. The bottom ARC is used to attenuate reflections from the underlying metal tungsten (W)-hardmask. Any reflections from the aluminum-copper layer (220) are already prevented by the presence of the W-hardmask over the aluminum-copper. Thus, having the hardmask immediately adjacent to the metal that is to be etched, the dimensional control of the patterns in the metal layer will be further improved. Tungsten is formed preferably by silicon reduction of tungsten hexafluoride, $WF_6$ at a flow rate between about 10 to 200 sccm, at pressure between about 1 to 100 torr, and temperature between about 350 to 500° C. The preferred thickness of W-hardmask is between about 500 to 3000 Å.

Figure 4B:
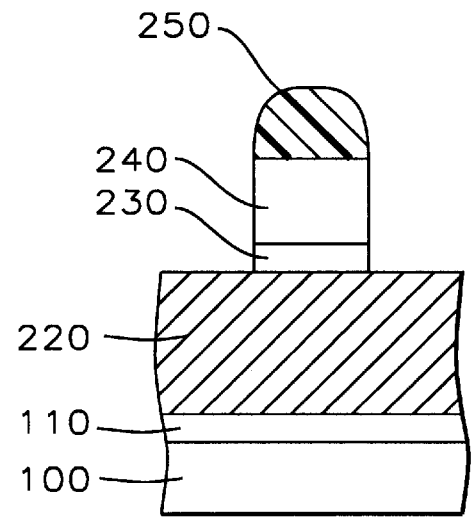
FIG. 4B is a partial cross-sectional view of a semiconductor substrate showing the forming of first the BARC layer and the preferred tungsten hardmask of this invention.

Commensurate with the submicron technology, the thickness of the aluminum-copper layer (220) is between about 3000 to 15000 Å. The process for etching the metal layer is started by first etching BARC and W-hardmask layers using recipe $SF_6$, $CF_4$, $CHF_3$, $N_2$ gases at an RF power between about 50 to 1500 watts, and pressure between about 5 to 150 mT. As seen in FIG. 4B, the upper portions of the photoresist is consumed, resulting in a rounded profile. The underlying layers of BARC and W-hardmask are protected by the thin photoresist layer, and therefore, they retain their sharp profile as shown in FIG. 4B. After the removal of the photoresist layer by oxygen plasma ashing, they still retain their original profile while the substrate is being subjected to chlorine based etch recipe in order to etch the aluminum-copper layer because W-hardmask, unlike ARC, is not consumed by etchant Cl in the recipe comprising $Cl_2$, Hcl, $Bcl_3$, $N_2$ gasses in an environment with a pressure between about 10 to 150 mT and power between about 100 to 2000 watts. (See FIG. 4C)

Figure 4C:
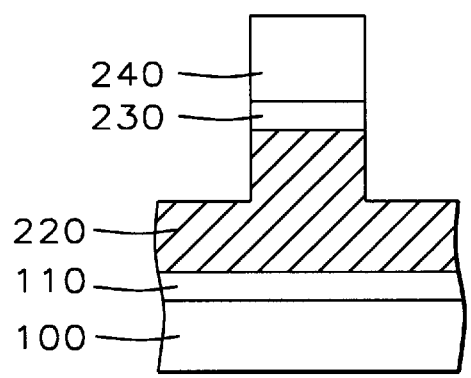
FIG. 4C is a partial cross-sectional view of a semiconductor substrate showing the non-erosion of the tungsten hardmask layers while etching the metal layer of this invention.
Figure 4D:
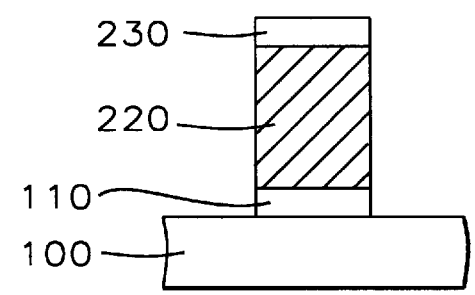
FIG. 4D is a partial cross-sectional view of a semiconductor substrate showing the unaltered profile of the pattern etched into the metal layer of this invention.

As a final step in the etching of the metal layer (220), the BARC is removed, and the thin W-hardmask is used as the mask to transfer the original pattern into the aluminum-copper layer. Because the chlorine based recipe has a very high selectivity ratio of 10:1 with respect to tungsten as measured against aluminum-copper, the W-hardmask is not consumed as shown in FIGS. 4C and 4D while the aluminum-copper layer is being etched. In other words, HARE is achieved with the resulting structure shown in FIG. 4D where the original dimensions of the pattern shown in FIG. 4A are retained after the completion of the process shown in FIG. 4D.

As still another embodiment of this invention, it has been found in the present manufacturing line that silicon-oxynitride (SiON) also performs well as a layer over the tungsten hardmask. It is preferred that the thickness of the SiON layer is between about 100 to 2000 Å.

A method of high aspect ratio etching (HARE) of metal layers in quarter micron technology has been disclosed. High aspect ratio patterns are encountered because of the shrinking lateral dimensions over the constant remaining thickness of the features of ultra large scaled integrated chips. HARE is accomplished by employing a tungsten hardmask with a high selectivity of 10:1 with respect to the immediately underlying aluminum-copper metal layer. In order to protect the lithographic integrity, overlying organic BARC is used to prevent reflections from the tungsten hardmask as well as from the underlying metal layer. The lithographic resolution is further improved by using a thin photoresist layer in combination with the high selectivity hardmask. In this manner, the tradeoff that normally has to be made between a high resolution process and a reliable metal etch is circumvented.

While the invention has been particularly shown and described with reference to the preferred embodiments thereof, it will be understood by those skilled in the art that various changes in form and details may be made without departing from the spirit and scope of the invention.

What is claimed is:

1. A method of forming a high selectivity metal etch masking film comprising the steps of:

providing a semiconductor substrate having a substructure of devices, and a first metal layer formed thereon;

forming a dielectric layer over said first metal layer;

forming a glue layer over said dielectric layer;

forming a second metal layer over said glue layer;

forming a W-hardmask layer over said second metal layer, wherein said hardmask layer is formed by silicon reduction of tungsten hexafluoride, $WF_6$ at a flow rate between about 10 to 200 sccm, at pressure between about 1 to 100 torr, and temperature between about 350 to 500° C.;

forming a bottom anti-reflective coating (BARC) over said W-hardmask layer;

forming an organic BARC layer over said W-hardmask layer;

forming a photoresist layer over said BARC;

forming said photoresist layer with metal pattern;

etching said metal pattern into said BARC and W-hardmask layer underlying said photoresist layer;

removing said photoresist layer;

removing said organic BARC layer; and transferring said line pattern in W-hardmask layer into said second metal layer, thus completing the patterning of said metal layer.

2. The method of claim 1, wherein said semiconductor substrate is silicon.

3. The method of claim 1, wherein said dielectric layer is PECVD oxide having a thickness between about 2500 to 3000 Å.

4. The method of claim 1, wherein said glue layer is titanium nitride having a thickness between about 250 to 1500 angstroms (Å).

5. The method of claim 1, wherein said second metal layer is aluminum-copper alloy.

6. The method of claim 1, wherein said second metal layer has a thickness between about 3000 to 15000 Å.

7. The method of claim 1, wherein the thickness of said hardmask layer is between about 500 to 3000 Å.

8. The method of claim 1, wherein said BARC is an organic material.

9. The method of claim 1, wherein said BARC has a thickness between about 500 to 2000 Å.

10. The method of claim 1, wherein said photoresist layer has a thickness between about 7000 to 12000 Å.

11. The method of claim 1, wherein said etching said metal pattern into said BARC and W-hardmask underlying said photoresist layer is accomplished with a recipe comprising $SF_6$, $CHF_3$, $CF_4$, $N_2$, $O_2$ at a pressure between about 10 to 1.50 mT, and power between about 100 to 2000 watts.

12. The method of claim 1, wherein said removing said photoresist layer is accomplished by oxygen plasma ashing.

13. The method of claim 1, wherein said removing said BARC layer is accomplished by $O_2$ plasma ashing.

14. The method of claim 1, wherein said transferring said line pattern in W-hardmask layer into said second metal layer is accomplished with an etch recipe comprising $Cl_2$, $BCl_3$, HCl, $N_2$ at a pressure between about 5 to 150 mT and power between about 100 to 2000 watts.

15. A method of forming a high selectivity metal etch masking film comprising the steps of:
   providing a semiconductor substrate having a substructure of devices, and a first metal layer formed thereon;
   forming a dielectric layer over said first metal layer;
   forming a glue layer over said dielectric layer;
   forming a second metal layer over said glue layer;
   forming a W-hardmask layer over said second metal layer, wherein said hardmask layer is formed by silicon reduction of tungsten hexafluoride, $WF_6$ at a flow rate between about 10 to 200 sccm, at pressure between about 1 to 100 torr, and temperature between about 350 to 500° C.;
   forming a silicon-oxynitride (SiON) over said W-hardmask layer;
   forming a photoresist layer over said SiON;
   forming said photoresist layer with metal pattern;
   etching said metal pattern into said SiON and said W-hardmask underlying said photoresist layer;
   removing said photoresist layer; and
   transferring said line pattern in W-hardmask layer into said second metal layer, thus completing the patterning of said metal layer.

16. The method of claim 15, wherein said semiconductor substrate is silicon.

17. The method of claim 15, wherein said dielectric layer is PECVD oxide having a thickness between about 2500 to 3000 Å.

18. The method of claim 15, wherein said glue layer is titanium nitride having a thickness between about 250 to 1500 angstroms (Å).

19. The method of claim 15, wherein said second metal layer is aluminum-copper alloy.

20. The method of claim 15, wherein said second metal layer has a thickness between about 3000 to 15000 Å.

21. The method of claim 15, wherein the thickness of said W-hardmask layer is between about 500 to 3000 Å.

22. The method of claim 15, wherein said silicon-oxynitride has a thickness between about 300 to 2000 Å.

23. The method of claim 15, wherein said photoresist layer has a thickness between about 7000 to 12000 Å.

24. The method of claim 15, wherein said etching said metal pattern into said silicon-oxynitride and said W-hardmask underlying said photoresist layer is accomplished with a recipe comprising $SF_6$, $CF_4$, $CHF_3$, $N_2$ gases at a pressure between about 5 to 150 mT and power between about 50 to 1500 watts.

25. The method of claim 15, wherein said removing said photoresist layer is accomplished by oxygen plasma ashing.

26. The method of claim 15, wherein said transferring said line pattern in W-hardmask layer into said second metal layer is accomplished with an etch recipe comprising $Cl_2$, $BCl_3$, HCl, $N_2$ gases at a pressure between about 5 to 200 mT and power between about 50 to 2000 watts.

* * * * *